United States Patent [19]
Olsson et al.

[11] Patent Number: 4,947,288
[45] Date of Patent: Aug. 7, 1990

[54] PRINTED CIRCUIT BOARD FOR MOUNTING IN A BACKPLANE

[75] Inventors: Torbjörn R. Olsson, Tullinge; Björn T. Kassman, Haninge; Karl Gustaf Olsson, Stockholm; Stig C. Ernolf, Sollentuna; Per-Ove Nilsson, Bandhagen; Rolf I. B. Kjellsson, Hägersten; Lars H. Widoff, Karlstad, all of Sweden

[73] Assignee: Telefonaktiebolaget L M Ericsson, Stockholm, Sweden

[21] Appl. No.: 401,165

[22] Filed: Aug. 31, 1989

[30] Foreign Application Priority Data

Oct. 12, 1988 [SE] Sweden .............................. 8803634

[51] Int. Cl.$^5$ .......................................... H01R 23/68
[52] U.S. Cl. ...................................... 361/413; 211/41; 361/415
[58] Field of Search .................. 211/41; 361/386–389, 361/413, 410, 417, 419–420

[56] References Cited

U.S. PATENT DOCUMENTS

| | | | |
|---|---|---|---|
| 3,810,433 | 5/1974 | Posner ................................. | 361/415 |
| 4,134,631 | 2/1979 | Conrad et al. ....................... | 361/415 |
| 4,158,220 | 6/1979 | Yamamoto et al. .................. | 361/415 |
| 4,697,858 | 10/1987 | Balakrishnan ....................... | 361/413 |

Primary Examiner—Gregory D. Thompson
Attorney, Agent, or Firm—Burns, Doane, Swecker & Mathis

[57] ABSTRACT

The present invention relates to a printed circuit board provided with electrical contact devices (7) and intended to be mounted in the back plane of a card frame (2) such as to form a magazine (1) in which printed circuit cards (6) having electrical contact devices (8) corresponding to the contact devices (7) on the board can be inserted at right angles to the back plane. The circuit board (3) forms an electrical connecting unit for the circuit cards in the back plane of the magazine. In accordance with the invention, the circuit board is configured to provide a self-supporting and stiffening structure in the form of a sandwich element (10).

6 Claims, 1 Drawing Sheet

PRINTED CIRCUIT BOARD FOR MOUNTING IN A BACKPLANE

TECHNICAL FIELD

The present invention relates to a printed circuit board provided with electrical contact devices and intended to be mounted in the back plane of a card frame such as to form a magazine for printed circuit cards capable of being inserted at right angles to the back plane and having electrical contact devices corresponding to the contact devices on the printed circuit board, the printed circuit board forming an electrical coupling unit which functions to connect the printed circuit cards to the back plane of the magazine.

BACKGROUND ART

Magazines intended for accomodating printed circuit cards included, for instance, in telephone exchange systems normally comprise a card frame which consists of two end plates, profiled sections which are screwed to respective end plates, and a back plate which is mounted in the back of the card frame and which functions to stiffen the actual card frame mechanically, and together with the profiled sections, to support a printed circuit board which constitutes the coupling unit between printed circuit cards inserted into the magazine at right angles to the printed circuit board. The printed circuit board and the printed circuit cards are provided with mutually cooperating devices, for connecting the card to the circuit board electrically.

Because the printed circuit board is relatively thin and has practically no resistance to bending and torsion forces, the forces occurring when inserting a printed circuit card into the magazine and removing a card therefrom are taken up by the rear profiled sections of the magazine and the back plate thereof. In the case of large magazines, it is necessary to further stiffen the printed circuit board, with the aid of additional profiled sections located in the back plane of the card frame. Consequently, the mechanical construction of the magazine in its back plane often becomes complicated and bulky. Attachment of the printed circuit board is also complicated and the various working steps involved are time consuming. Furthermore, the requisite mechanical stiffening of the printed circuit board means renders part of the board surface unavailable for use, because of the presence of the necessary attachment devices.

DISCLOSURE OF INVENTION

Consequently, the object of the present invention is to avoid the drawbacks associated with known magazines, by configuring a printed circuit board as a self-supporting structure, in the form of a torsionally rigid sandwich element.

According to one preferred embodiment, the sandwich element comprises a spacer element which is bonded to a bottom plate and also to the printed circuit board.

The spacer element preferably comprises a layer of foam plastic, and the bottom plate is preferably manufactured from a material which has the same coefficient of linear expansion as the printed circuit board.

According to one preferred embodiment, the spacer element covers the whole or the rear side of the printed circuit board. The printed circuit board is preferably provided along the edges thereof with fastener elements or through-passing holes for attachment of the board to the card frame with the aid of screws or other fasteners.

The spacer element is preferably mounted on the printed circuit board, subsequent to completing the construction of the board and testing the same.

A printed circuit board configured in accordance with the invention provides several advantages. One advantage is that no separate mechanical constructions need be arranged in the back plane of the card frame for the purpose of taking up forces and for stiffening the magazine, since the forces which occur when inserting the printed circuit cards into the magazine and when removing said cards therefrom are taken up by the printed circuit board itself, which also serves to stiffen the card frame.

Another advantage is that because no separate devices are required for stiffening the printed circuit board in the card frame, the whole of the surface of said board is available for coaction with electrical contact devices. The contact devices can therefore be placed freely within the surface area provided and enables the use of different types of electrical contact devices.

A further advantage is that the size of the self-supporting, torsionally, rigid printed circuit board is not restricted by the presence of mechanical stiffening constructions in the back plane of the magazine, and consequently the board can be manufactured in sizes which are independent of the size of the card frame, i.e. there can be produced a printed circuit board for common use with several magazines at one and the same time.

Further advantages afforded by an inventive printed circuit board will be apparent from the following description and the accompanying drawing.

BEST MODE FOR CARRYING OUT THE INVENTION

Figure 1:
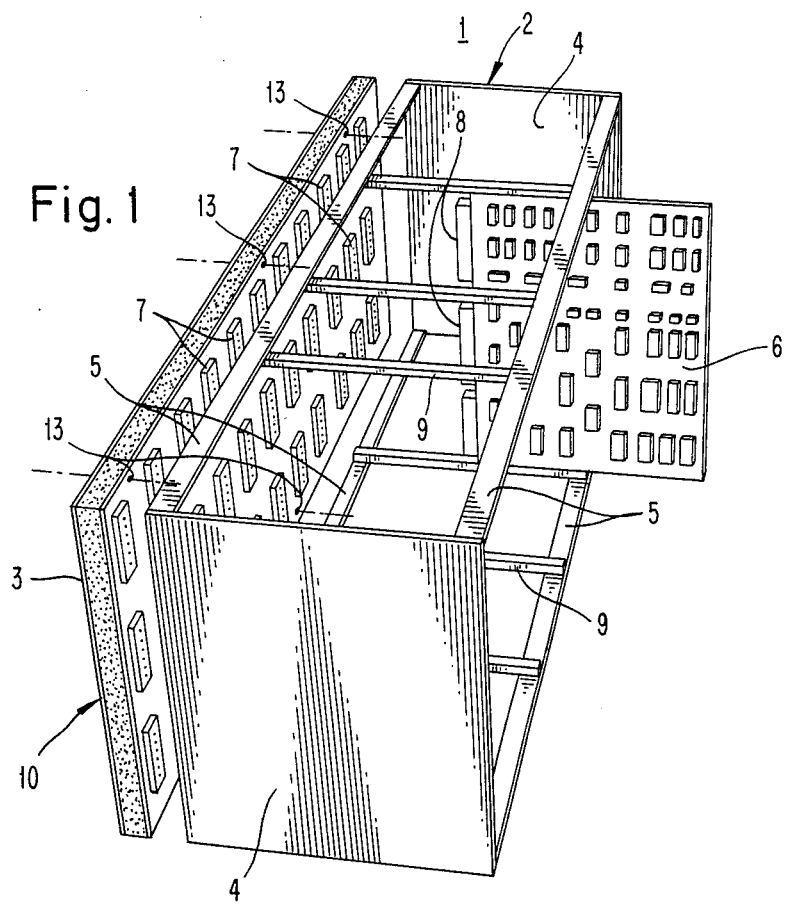
FIG. 1 illustrates schematically and in perspective a card frame and a printed circuit board according to the invention, intended for forming a circuit card magazine.

FIG. 1 is a perspective view of a magazine 1 which comprises a card frame 2 and a printed circuit board 3 according to the invention. The card frame 2 is of conventional construction, and consists of two end plates 4 and four profiled sections 5 which connect the end plates together and are fastened at respective corners, for instance by means of screws. The card frame 2 is normally made of aluminium. Instead of the conventional back plate, the back plane of the magazine 1, however, consists of a printed circuit board 3, the nature of which will be described in more detail.

Printed circuit cards 6 can be inserted perpendicularly to the thus formed back plane of the magazine, i.e. perpendicularly to the printed circuit board 3. The board 3 constitutes an electrical connecting unit between the printed circuit cards 6 and is, to this end, provided with electrical contact devices 7, whereas the printed circuit cards are provided with electrical contact devices 8 corresponding to the contact devices of the printed circuit board, as shown schematically in FIG. 1. The cards 6 are guided in the card frame 2 by means of guide rails 9, for instance plastic rails, which extend in the card frame 2 beneath the upper and lower profiled sections 5 respectively.

Figure 2:
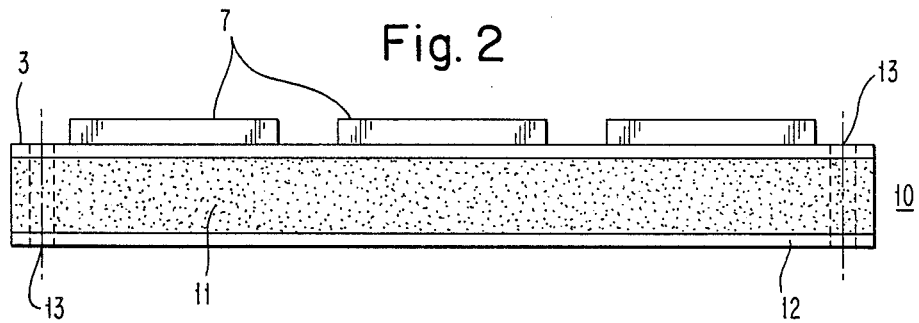
FIG. 2 is a side view of the inventive printed circuit board.

The printed circuit board 3 will now be described with reference to FIG. 2. The board is manufactured, e.g., of glass-fibre reinforced epoxy-resin and is provided with conductor paths, such as to enable the board to function as an electrical connecting unit for the printed circuit cards 6. As beforementioned, electrical contact devices 7 are mounted on the front face of the board. In order to make the board 3 a self-supporting unit, the rear side of the board is configured with a stiffening construction in the form of a sandwich element 10. According to one preferred embodiment, the sandwich element 10 comprises a spacer element 11 bonded adhesively to a bottom plate 12 and secured to the circuit board. The spacer element comprises a layer of foamed plastic, e.g. PVC, and the bottom plate 12 is manufactured from a material which has the same coefficient of linear expansion as the printed circuit board 3, normally a glass-fibre reinforced epoxy. The spacer element 11 is bonded adhesively to the circuit board 3, preferably subsequent to said board having been completed and tested and provided with electrical contact devices 7.

In order to enable the board 3 to be mounted in the back plane of the card frame 2, the board 3 is provided along the edges thereof with through-passing holes 13, and the board 3 is screwed firmly to the rear profiled sections 5 of the card frame 2, or fastened in some other suitable manner. Alternatively, fasteners can be provided along the edges of the printed circuit board and fastened to the profiled sections of the card frame.

Because the printed circuit board is a self-supporting, stiffening structure, as described in the aforegoing, no separate mechanical reinforcements are required in the back plane of the magazine, in order to stiffen the magazine and to support the circuit board. Furthermore, because the circuit board is attached to the card frame solely along the edge surfaces of the board, the whole of the surface of the board is avilable for the provision of electrical contact devices, which can thus be placed freely within the available surface area.

It will be understood that the invention is not restricted to the described and illustrated embodiment, and that modifications can be made within the scope of the accompanying claims.

We claim:

1. A printed circuit board provided with electrical contact devices mounted on a back plane of a card frame so as to form a magazine in which printed circuit cards can be inserted perpendicularly to said back plane, said circuit cards having electrical contact devices which correspond to said contact devices on said printed circuit board, said printed circuit board forming an electrical connecting unit for said circuit cards located on said back plane of the magazine, wherein said printed circuit board is a self-supporting and stiffening construction in the form of a sandwich element, said sandwich element comprising a spacer element which is bonded adhesively to said printed circuit board and to a bottom plate.

2. A printed circuit board according to claim 1, characterized in that the spacer element comprises a layer of a foamed plastic.

3. A printed circuit board according to claim 1, wherein said bottom plate is made of a material which has the same coefficient of linear expansion as said printed circuit board.

4. A printed circuit board according to claim 1, wherein said spacer element covers the whole of the rear surface of said printed circuit board.

5. A printed circuit board according to claim 1, wherein said spacer element is mounted on said printed circuit board subsequent to said printed circuit board having been completed and tested and provided with said electrical contact devices.

6. A printed circuit board according to claim 1, wherein said printed circuit board is provided along the edges thereof with through-passing holes for attaching said printed circuit board to said card frame with the aid of screw fasteners.

* * * * *